US010529527B2

(12) United States Patent
Sebald

(10) Patent No.: US 10,529,527 B2
(45) Date of Patent: Jan. 7, 2020

(54) X-RAY SOURCE FOR IONIZING OF GASES

(71) Applicant: ESTION TECHNOLOGIES GMBH, Griesheim (DE)

(72) Inventor: Thomas Sebald, Darmstadt (DE)

(73) Assignee: ESTION TECHNOLOGIES GMBH, Griesheim (DE)

(*) Notice: Subject to any disclaimer, the term of this patent is extended or adjusted under 35 U.S.C. 154(b) by 169 days.

(21) Appl. No.: 15/552,388

(22) PCT Filed: Feb. 24, 2016

(86) PCT No.: PCT/DE2016/100081
§ 371 (c)(1),
(2) Date: Aug. 21, 2017

(87) PCT Pub. No.: WO2016/134701
PCT Pub. Date: Sep. 1, 2016

(65) Prior Publication Data
US 2018/0247785 A1 Aug. 30, 2018

(30) Foreign Application Priority Data
Feb. 24, 2015 (DE) .................. 10 2015 102 612

(51) Int. Cl.
H01J 35/06 (2006.01)
H01J 35/18 (2006.01)
(52) U.S. Cl.
CPC ............ H01J 35/065 (2013.01); H01J 35/18 (2013.01); H01J 2235/18 (2013.01)

(58) Field of Classification Search
CPC ............ H01J 2235/18; H01J 2235/186; H01J 35/065; H01J 35/18
See application file for complete search history.

(56) References Cited

U.S. PATENT DOCUMENTS

| 3,665,241 A | 5/1972 | Spindt et al. |
| 5,229,682 A | 7/1993 | Komatsu |
| 5,729,583 A | 3/1998 | Tang et al. |
| 6,259,765 B1 * | 7/2001 | Baptist .................. H01J 35/065 313/309 |

(Continued)

FOREIGN PATENT DOCUMENTS

| DE | 69111651 T2 | 4/1996 |
| DE | 69818364 T2 | 4/2004 |

(Continued)

OTHER PUBLICATIONS

International Search Report issued in PCT/DE2016/100081, dated Jun. 29, 2016.

Primary Examiner — Marcus H Taningco
(74) Attorney, Agent, or Firm — Heslin Rothenberg Farley and Mesiti PC; Nicholas Mesiti

(57) ABSTRACT

An X-ray source for ionizing of gases includes a field emission tip array within a vacuum region enclosed by a hood and a part of a support plate. The field emission tip array is arranged electrically insulated with respect to the carrier plate and wired as a cathode connected to a high-voltage source. A transmission window transparent to X-ray radiation is arranged in the hood centrally above the field emission tip array, and the hood is wired as an anode.

16 Claims, 2 Drawing Sheets

(56) References Cited

U.S. PATENT DOCUMENTS

Figure 2:
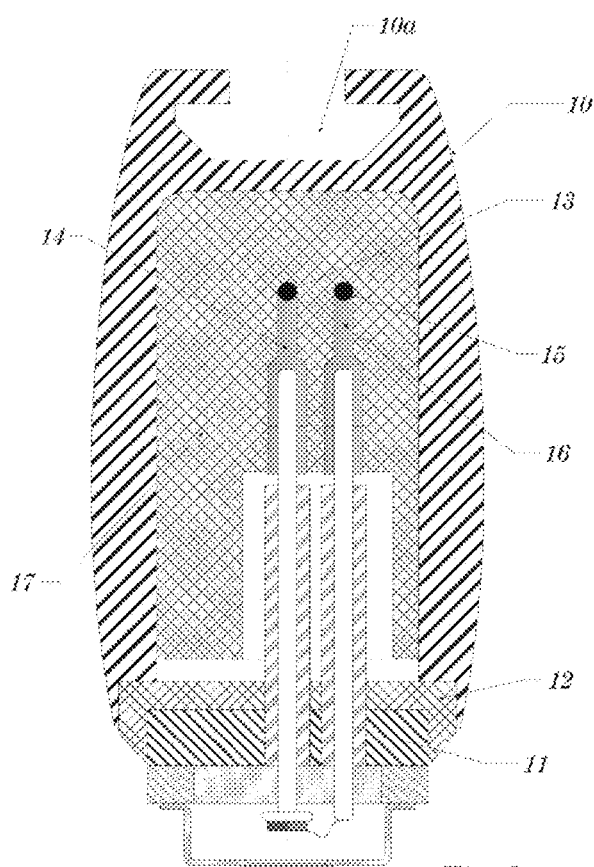

| | | | |
|---|---|---|---|
| 6,477,233 B1* | 11/2002 | Ribbing | A61N 5/1001 378/119 |
| 6,807,044 B1 | 10/2004 | Vernitsky et al. | |
| 2016/0274038 A1* | 9/2016 | Brady | E21B 49/00 |

FOREIGN PATENT DOCUMENTS

| | | |
|---|---|---|
| DE | 60034040 T2 | 8/2008 |
| DE | 102009031985 A1 | 1/2010 |
| EP | 1058286 A1 | 12/2000 |
| JP | 2010218696 A | 9/2010 |
| WO | 1998036796 A1 | 8/1998 |
| WO | 2009031764 A2 | 3/2009 |

* cited by examiner

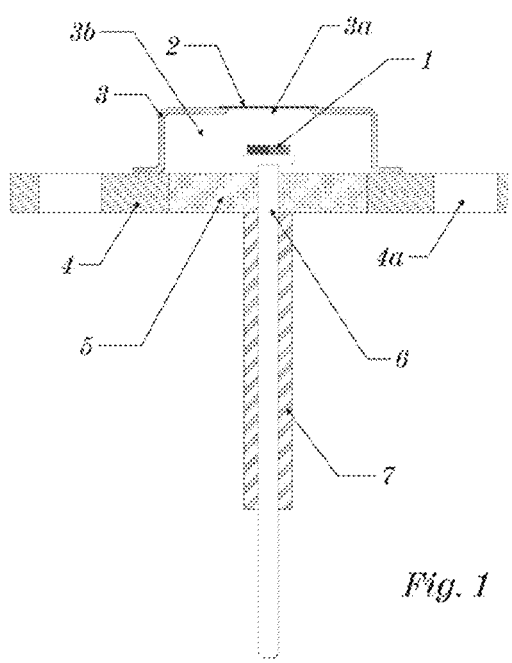
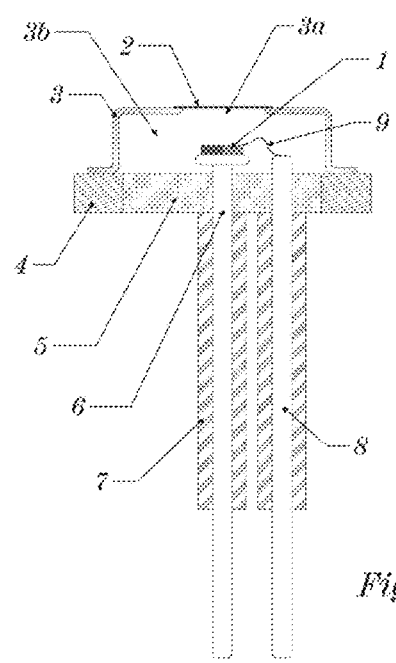
Fig. 1
Fig. 1a

X-RAY SOURCE FOR IONIZING OF GASES

CROSS REFERENCE TO RELATED APPLICATIONS

This application is the National Phase filing under 35 U.S.C. § 371 of International Application No. PCT/DE2016/100081, filed on Feb. 24, 2016, and published, in German, on Sep. 1, 2016, as WO/2016/134701 A1, and claims priority to German Application No. 102015102612.0, filed on Feb. 24, 2015. The contents of each of the prior applications are hereby incorporated by reference herein in their entirety.

BACKGROUND ART

The invention relates to an X-ray source for ionizing of gases, with a field emission tip array in a vacuum chamber.

Such X-ray sources for ionizing of gases consist of multiple individual X-ray sources arranged lengthwise in a row by means of a bar-shaped carrier and supplied with a required voltage. The X-ray sources are mounted here in an air flow in such a manner that they ionize the surrounding air of the bar-shaped arrangement. The air that has been ionized in this manner can be used for the neutralization of electrostatic charges in critical fabrication areas.

For example, such X-ray sources can be inserted in the usually vertical air flow in the clean room of fabrication installations in the microelectronics industry, in order to neutralize electrostatic charges on objects by means of the ionized gases. This is necessary because electrostatic charges lead to increased particle deposition. On the other hand, uncontrolled discharges can cause damage to the microstructures. The electrostatic discharges are referred to as ESD (ElectroStatic Discharge). Ion generators are also used for generating a predetermined ion density of differently charged ions within a cabin or other space, wherein the recombination of the ions usually starts immediately after they have been generated.

The commonly used ionization systems generate the ions by means of a high voltage at tip electrodes via gas discharge. In the process, both direct current voltage and also alternating current voltage, or so-called pulsed direct current voltage, are used. Thus, different methods are used in order to minimize the recombination of positive and negative ions. An essential aspect of these ionizers is the achievement of a balanced ratio of positive and negative ions in order to ensure complete neutralization of the charges.

Thus, DE 600 34 040 T2 discloses an ion generator device, in which several upright emission needles next to one another made of titanium, platinum, a titanium-platinum compound or made of a rust-free metal, or of different alloys are used. The emission needles consist of a cylindrical core which is enclosed by a composite material made of an unsaturated polyester compound containing glass fibers. Each needle tip ends outside of a housing in a conical indentation which can be covered by a grate. At the needle tip, a strong voltage field or a potential difference along the needle is generated in order to ensure the generation of electrons by the emission tips. For this purpose, the needles are directly connected to a high-voltage source with a high voltage of 4.3-6 kV. The needle tips can additionally be coated with a gold film.

Moreover, DE 691 11 651 T2 discloses a clean-room corona air ionizer which is provided with at least one corona tip connected to a high-voltage source. The corona tip is located within a tube which is closed off at one end and an anhydrous hydrogen-rich gas flows around the tip. This corona air ionizer enables the removal of microcontaminations such as ammonium nitrate accumulations which can form in corona ionizers.

In DE 698 18 364 T2, germanium emitting electrodes are used, in order to reduce metal contaminations during the production of integrated circuits to the lowest possible level. The emitter electrode has a tip which ends with a conical radius. The germanium emitters are semiconducting and have a specific resistance of approximately 0.1-100 Ωcm. In order to achieve this, the germanium emitters are preferably doped with antimony.

U.S. Pat. No. 5,729,583 relates to a miniature low-energy X-ray source for diagnostic radiography with an emission tip array arranged in a vacuum chamber on a cathode surface, and wherein a flat gate arrangement is provided above the emission tip array. The associated anode in the form of a metal film extends in the vacuum chamber along the inner wall and in front of a collimator before the emission tip array. The emission tips are located in cylindrical openings of the flat gate arrangement, and an insulation layer extends between the cathode surface and the gate arrangement.

A similar construction for an emission tip array is disclosed in U.S. Pat. No. 3,665,241.

DE 10 2009 031 985 A1 discloses an ionizer with multiple electrode pairs having different electrode lengths arranged on the periphery of a circle and protruding into an air flow, in which the positive and negative ion flows do not overlap. In this manner, the number of ions neutralized by new recombination is reduced, so that the discharge efficiency on the work piece to be protected is improved.

However, in most cases, the systems used are in the shape of bars, wherein, on the lower side, the emitter tips integrated in the high-voltage lead protrude outward.

U.S. Pat. No. 6,807,044 B1 discloses a typical example of such a system. Here, a support bar in the shape of a bar supports a plurality of pointed emitter electrodes next to one another, each of which is accommodated within a tube-shaped sheathing that is open at one end. The support bar is enclosed by a housing, in which the required power supply is accommodated.

Similar bar-shaped ionization devices are also described in WO 2009/031764 A2 and in JP 2010 218696 A.

Such ionization devices are commonly arranged in an air flow generated by an ultra-clean air installation and directed onto the work pieces to be protected, such as semiconductor wafers or other sensitive fabrication devices.

Such gas discharge ionization systems operated at high voltage have a number of disadvantages. Thus, the balance between the generated negative and positive ions depends very strongly on the high-voltage power supply and the geometric arrangement of the emitter electrodes. I.e., pulsed or alternating high-voltage systems exist, in which positive and negative ions are generated successively in a temporal sequence.

Direct current voltage systems have spatially offset emitter electrodes for positive and negative high-voltage. Thereby, the respective polar ions are generated at different sites, which in turn leads to imbalances in the polarity distribution and, as a result, to charging processes in the area of influence. These processes are site-dependent charging processes in each case.

Moreover, the long-term polarity balance is unstable, since the emitter electrodes change over the course of time. The high-voltage ionizers consequently have to be checked and readjusted constantly.

In addition to the influence due to different ion concentrations, there are also undesired influences of the ion-generating high voltage on the emitters, which frequently exceeds 15 kV.

In particular, in installation situations in which the products to be neutralized come close to the ionizers, considerable potential differences are sometimes generated due to the electrical field influence.

In addition, on the emitter electrodes themselves, under ultra-clean air conditions, particulate contaminations form due to electrochemical conversion processes, which impair quality in the ultra-clean fabrications of the microstructure industry. The emitters of high-voltage ionizers therefore have to be cleaned regularly, which is associated with an interruption of the production sequence.

With increasingly smaller structures, the sensitivities of the substrates to electrostatic charges continue to increase. With the structure sizes of today, the limitations of the high-voltage ionizers used are obvious and other options are sought.

Thus, ionization systems which generate air ions by means of low-energy X-ray radiation are commercially available. Here, an energy range below 5 keV is used increasingly. These systems in which X-ray tubes are used have the advantage that they have no electric field effect toward the outside and the ion polarity balance is always perfectly equilibrated. This is due to the fact that the ions in the air volume are generated by means of ionizing radiation by cleaving off an electron and the associated remaining of the positive ion core. Beyond this, no contaminations are formed.

The disadvantage of this system is, on the one hand, the relatively high price, and, on the other hand, the low useful life of the X-ray tubes used. In the currently used systems, X-ray tubes with incandescent cathodes are utilized, which, as a rule, have a useful life of approximately one year. This means that the X-ray tubes have to be replaced annually, which is time consuming and expensive.

An additional disadvantage of these systems consists in that they are quite large and therefore often difficult to integrate in installations, and, in addition, they contain the relatively expensive control electronics and monitoring needed for incandescent cathodes.

An example of such an in-line gas ionizer is disclosed in WO 01/84683 A2. This ionizer comprises pressurized air sources with an air channel for the fabrication device and an X-ray radiation source integrated in the air channel.

BRIEF SUMMARY OF THE INVENTION

In the case at hand, the underlying aim of the invention is to create a device for ionizing of gases, which, on the one hand, combines the simple, compact and cost-effective design and arrangement of the bar-shaped high-voltage ionizers with the advantages of low-energy X-ray ionizers and, on the other hand, avoids the disadvantages of the known X-ray systems.

The aim is achieved in that a field emission tip array with field emission tips is arranged within a vacuum region which is enclosed by a hood and a part of a carrier plate, wherein the field emission tip array provided with field emission tips is arranged electrically insulated with respect to the carrier plate and wired as a cathode connected to a high-voltage source, wherein a transmission window which is transparent to X-ray radiation is arranged in the hood centrally above the field emission tip array, and wherein the hood is wired as an anode.

The field emission tip array consists of a flat cuboid base body, from which a plurality of field emission tips protrude.

The field emission tips are preferably designed in the shape of a pointed cone or else a rod; they protrude perpendicularly from the cuboid base body and are arranged distributed in a regular array over the surface of the base body.

In particular, in order to avoid high field strengths, the emission tips end in rounded points in a development of the invention.

The field emission tip array consists of metal or of a semiconductor material.

In a particular design of the invention, the field emission tips are enclosed by an insulator in such a manner that the region surrounding the points of the field emission tips is recessed in the shape of a crater, and that the field emission tips lead into a volcanic-cone-like collar which tapers in the direction toward the point of the field emission tip and which concentrically surrounds the field emission tips forming a gate and circumferentially delimits the crater.

The points of the field emission tips can protrude out of the collar.

Moreover, between the adjacent collars, sinks are formed, wherein the entire surface of the field emission tip array, with the exception of the crater located in the collar, is coated with a metal layer.

To continue the invention, the hood is connected in a vacuum-tight manner to the carrier plate and consists of a metal, wherein the carrier plate is connected to ground potential.

Moreover, the transmission window is designed as a beryllium surface which is coated on the vacuum side with a suitable friction material such as tungsten. Instead of beryllium as transmission surface, other suitable materials, such as diamond, can also be used.

The field emission tip array is arranged within the vacuum region on an electrode and is electrically connected to said electrode, wherein the electrode extends through the insulation body.

In order to enable a controlling of the anodic current, a gate electrode is connected in an electrically conductive manner via a wire bridge to the metal layer of the field emission tip array, wherein the gate electrode next to the electrode penetrates through the insulation body.

The radius of the point of the field emission tips is preferably 2 nm, so that a high field-line density in the direction toward the anode is achieved.

Moreover, the voltage applied to the gate electrode is 20-100 V, and the operating voltage of the X-ray source is <5 kV and at the field emission tip array wired as a cathode is between −4980 and −4900 V.

The miniaturized X-ray source is particularly suitable for use with a bar-shaped multi-part support system which consists of a hollow bar-shaped support profile, in which, on a longitudinal side, a support profile consisting of metal is inserted in an insulating manner, and to which a plurality of the X-ray sources are fastened in the longitudinal extension of the support profile spaced apart next to one another in such a manner that the electrodes extend into the support profile and are connected to high-voltage leads extending along the support profile, and that the X-ray sources protrude into the environment of the support system, and wherein the inner space of the support profile is filled with a high-voltage insulation.

Therefore, in the present invention, a miniaturized, low-energy X-ray source, which uses a microtip array as a cathode and which per se is known for other applications, is used. As a result of the use of such a tip array as a cathode, which generates the electrons based on the quantum mechanical tunnel effect at high field strengths at the tips, useful lives of several years can be ensured. In addition, the use of microelectronics fabrication methods, which are designed for mass production of small components, is made possible, leading to acceptable costs.

By means of the miniaturization of the X-ray source, construction in the proven bar shape is then possible, so that the simple power supply and monitoring electronics can be integrated for any number of X-ray sources that can be arranged in a row.

BRIEF DESCRIPTION OF THE DRAWING FIGURES

Figure 3:
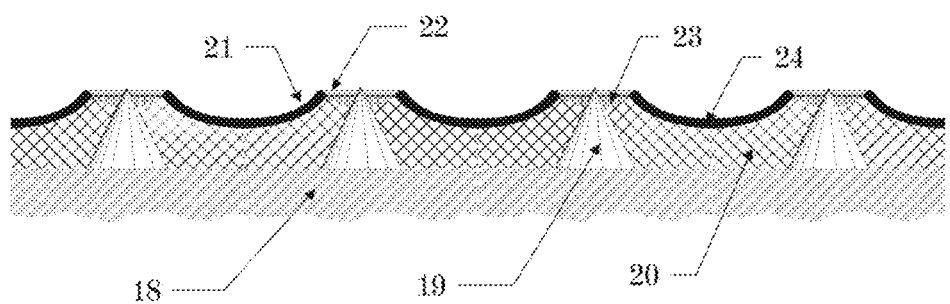

Below, the invention will be explained in greater detail in embodiment examples. In the associated drawings, the figures show:

FIG. 1: a miniaturized X-ray source with a field emission tip array within a vacuum region, FIG. 1a: an X-ray source according to FIG. 1 provided with a "gate" arrangement;

FIG. 2: a design of the X-ray source according to FIG. 1a as component of a bar-shaped support system, and FIG. 3: a cross section of the field emission tip array according to FIG. 1.

DETAILED DESCRIPTION

In FIG. 1, a miniaturized low-energy X-ray source is represented, which is provided with a field emission tip array 1 mounted on an electrode 6 above an insulation body 5 or on said insulation body. The electrical and mechanical connection between the field emission tip array 1 and the electrode 6 (cathode) is carried out by chip bonding or with the aid of an electrically conductive adhesive. The insulation body 5 is introduced flush and in a vacuum-tight manner into a metal carrier plate 4 or is arranged on said carrier plate, wherein the electrode 6 penetrates through the insulation body 5. The electrode 6 is supplied with the necessary cathode voltage of a suitable high-voltage source.

The field emission tip array 1 consists of a cuboid base body 18 made of metal or a semiconductor material, from which a plurality of emission tips, arranged in an array with regular spacings from one another, protrude perpendicularly. The emission tips can be designed in the shape of a pointed cone or a rod and can have rounded ends. Such a field emission tip array 1 can be manufactured by fabrication methods of microstructuring technology as are known from the semiconductor technology.

For the formation of a vacuum region 3b surrounding the field emission tip array 1, said vacuum region is enclosed by a hood 3 which is made of a metal and is connected to the carrier plate 4 in an electrically conductive and vacuum-tight manner. The hood 3 is used as anode and connected to the ground. The design of the X-ray source according to the invention corresponds basically to that of a housing for power transistors, such as a TO-5 or TO-39 housing.

In order to ensure a considerably better useful life and longevity of the field emission tip array 1 in comparison to the incandescent cathodes used to date, any sputtering processes due to residual gas atoms have to be avoided. This means that the better the vacuum is, the longer the useful life is. Therefore, in practice, a vacuum of $<10^{-6}$ hPa should be provided.

A bore 3a, which is closed with a conventional transmission window 2 for X-ray sources, such as a beryllium surface, for example, is located in the hood 3 centrally above the field emission tip array 1 and is coated on the vacuum side with tungsten as friction material, wherein other suitable materials can also be used as friction material. It is also possible to close the bore 3a with other suitable window variants which are transparent to X-ray radiation. The hood 3 and the carrier plate 4 are at the same potential and are connected to an anode potential of the high-voltage source, i.e., to the ground or ground potential.

The transmission window 2 can also consist of other materials that are satisfactorily transparent to X-ray radiation, such as diamond, for example. Moreover, the carrier plate 4 is provided with fastening bores 4a so that it can be screwed or fastened otherwise to a bar-shaped carrier, not represented, for the purpose of good heat dissipation.

In order to ensure a sufficient high-voltage creepage distance, the electrode 6 is sheathed with an insulation 7 under the insulation body 5 on the atmospheric side.

The field emission tip array 1 can also be provided with a "gate" arrangement for controlling the anodic current, as represented diagrammatically in FIG. 1a and FIG. 3.

Such a "gate" arrangement can be implemented by a separate gate electrode 8, which is connected to the field emission tip array 1 in an electrically conductive manner by wire bonding and production of a wire bridge 9. The gate electrode 8 is arranged next to the electrode 6, penetrates through the insulation body 5 and protrudes into the vacuum region 3b. Under the insulation body 5, i.e., on the atmospheric side, the gate electrode 8 is also sheathed with an insulation 7. Otherwise this variant corresponds to the design according to FIG. 1.

For reasons having to do with the potential distribution, the spacing between the tips of the field emission tip array 1 with respect to the anode, i.e., the beryllium surface of the transmission window 2, should be much greater than the spacing between the tips of the field emissions tips array 1 and the gate electrode 9 formed by a collar which is described below. The tip-gate spacing is between 100 and 500 nm. This means that the anode spacing is at least 100-500 μm, wherein the spacing of 1-3 mm is selected preferably for reasons having to do with the mechanical handling.

In FIG. 3, a cross section of a detail of the field emission tip array 1 corresponding to FIG. 1 and constructed on a base body 18, with field emission tips 19 arranged in a regular array, is represented. The field emission tips 19 are sheathed substantially on all sides with an insulator 20 such as $SiO_2$, wherein only the region directly surrounding the points of the field emission tips 1 is kept free in the manner of a crater.

The field emission tips 19 extend through the insulator 20 and lead with the respective point thereof into a collar 21, which is made of a conductive material, and which tapers in the manner of a volcanic cone in the direction of the field emission tip 19 and concentrically surrounds the point, which protrudes from the crater 23, of the field emission tips 19 forming a gate. The crater 23 is at the same time circumferentially delimited by the collar 21. The field emission tips 19 can protrude from the collar 21, that is to say they can project over said collar. The margin of the collar 21 surrounding the field emission tips 19 is connected to the gate 8.

The region in between the collar 21 in each case forms a sink extending to the respective adjacent collar, wherein the entire surface of the field emission tip array 1, except for the crater 23 located in the collar 21, is coated with a metal layer 24.

FIG. 2 shows a design of the X-ray source according to FIG. 1*a* as a component of a bar-shaped support system, wherein multiple X-ray sources are arranged next to one another in the longitudinal extension of the support system. The bar-shaped support system for the miniaturized X-ray sources according to the invention consists of an elongate support profile 10 made of metal or plastic, which can be produced by extrusion, for example. Located within the support profile 10, at an appropriate site, is the necessary power supply for the cathode voltage and also for the gate voltage if a gate electrode 8 for controlling the anodic current is provided.

The miniaturized, low-energy X-ray source according to the invention generates electrons based on a quantum mechanical tunnel effect at high field strengths, wherein a useful life of several years can be ensured. The fabrication of the miniaturized X-ray source can be carried out without problem and cost effectively using microelectronics fabrication methods.

The miniaturized X-ray source according to FIG. 1 or 1*a* is fastened on the bar-shaped multi-part support system with the profile 10, as represented in FIG. 2. The support profile 10 is provided on one side—top of FIG. 2—with a fastening groove 10*a*, so that the support profile 10 can be fastened on a suitable fixed holder. On the side facing the fastening groove, an extruded metal fastening profile 11 for fastening the miniaturized X-ray source according to the invention is provided, which is arranged in a plastic profile 12, which is inserted in a recess in the support profile 10 and thus produces an electrical insulation between the support profile 10 and the fastening profile 11. The electrical insulation between the fastening profile 11 and the support profile 10 is only necessary if the latter consists of metal.

The miniaturized X-ray sources according to the invention are fastened at predetermined spacings on the fastening profile 11 which, in addition to the mechanical fastening, is also used for the electrical contacting of the anode of the X-ray sources, i.e., of the hood 3 and of the carrier plate 4, the anode typically being at ground potential. Here, the electrodes 6, 8 extend into the support profile 10 and are connected to high-voltage leads 13, 15 extending along the support profile 11. The X-ray sources here protrude out of the support system into the environment.

By means of the plastic profile 12, it is possible to measure the anodic current via measurement electronics connected to the fastening profile, in that said measurement electronics are connected to ground potential. In this manner, the monitoring of the operation of the miniaturized X-ray source can be implemented.

In the support profile 10, a longitudinally extending a high-voltage lead 13 for the cathode and optionally a high-voltage lead 15 for the gate electrode 8 are found. Moreover, the interior space of the support profile 10 is connected by casting with a high-voltage insulation 17. Moreover, the electrode 6 and the gate electrode 8 are inserted in corresponding bushes 14 and 16, which are electrically connected to the high-voltage leads 13 and 15.

The operating voltage for the X-ray source should be in the range of <5 kV due to practical considerations, since the administrative expenditure in this energy range is clearly lower, since the ionizing rays generated in this range are usually not considered to be X-ray radiation sources. However, if necessary, the X-ray source according to the invention can also be operated without problem at a higher operating voltage.

During the operation of the X-ray source according to the invention, electrons are extracted by field emission from the tips of the field emission tip array 1 due to the high field strength at the tips, wherein the field strength at the tips is determined by the potential difference between tip and gate as well as by the geometric arrangement thereof.

For example, a field strength of $10^9$ V/m is achieved with a tip radius of 2 nm, an annular gate with a diameter of 100 nm on the tip plane and a gate potential with respect to the tips of 60 V.

The electrons that have exited are then accelerated behind the gate due by the acceleration high voltage between cathode and anode to said high voltage. The acceleration high voltage remains constant during the operation of the X-ray source, since the maximum radiation energy is determined by this voltage.

The gate voltage should be adjustable in a range of 20-100 V, wherein the anodic current to be measured is used as control parameter. Cathode and gate are at <−5000 V (cathode tips) or −4980 to −4900 V (gate ring), wherein the anode is at ground potential. The cathode gate voltage is separated galvanically via optical couplers which are regulated by a controller.

X-Ray Source for Ionizing of Gases

LIST OF REFERENCE NUMERALS

1 Field emission tip array
2 Transmission window
3 Hood
3*a* Bore
3*b* Vacuum region
4 Carrier plate
4*a* Fastening bores
5 Insulation body
6 Electrode
7 Insulation
8 Gate electrode
9 Wire bridge
10 Support profile
10*a* Fastening groove
11 Fastening profile
12 Plastic section
13 High-voltage lead
14 Bush
15 High-voltage lead
16 Bush
17 High-voltage insulation
18 Base body
19 Field emission tip
20 Insulator
21 Conductive gate
22 Gate
23 Crater
24 Metal layer

The invention claimed is:
1. An X-ray source for ionizing of gases, with a field emission tip array in a vacuum chamber, comprising:
   a field emission tip array with field emission tips arranged within a vacuum region enclosed by a hood and part of a carrier plate, wherein the field emission tip array is arranged electrically insulated with respect to the carrier plate and wired as a cathode connected to a high-voltage source, wherein a transmission window transparent to X-ray radiation is arranged in the hood centrally above the field emission tip array, wherein the hood is wired as an anode, wherein the hood is connected in a vacuum-tight manner to the carrier plate and comprises a metal, and wherein the carrier plate is connected to ground potential.

2. The X-ray source according to claim 1, wherein the field emission tip array consists of a flat cuboid base body, from which a plurality of emission tips protrude.

3. The X-ray source according to claim 2, wherein the emission tips have the shape of a pointed cone or a rod and protrude perpendicularly from the cuboid base body and are arranged distributed in a regular array over a surface of the base body.

4. The X-ray source according to claim 3, wherein the emission tips have rounded ends.

5. The X-ray source according to claim 1, wherein the field emission tip array comprises metal or a semiconductor material.

6. The X-ray source according to claim 1, wherein the field emission tips of the field emission tip array are enclosed by an insulator, in such a manner that a region surrounding points of the field emission tips is recessed in the shape of a crater, and that the field emission tips lead into a volcanic-cone-like metal collar which tapers in a direction toward a point of the field emission tip and which concentrically surrounds the field emission tips forming a gate and circumferentially delimits the crater.

7. The X-ray source according to claim 6, wherein the field emission tips protrude from the collar.

8. The X-ray source according to claim 6, wherein, between adjacent collars, sinks are formed, wherein an entire surface of the field emission tip array, with the exception of the crater located in the collar, is coated with a metal layer.

9. The X-ray source according to claim 1, wherein the transmission window comprises beryllium or diamond and is coated on a vacuum side with tungsten or another friction material.

10. The X-ray source according to claim 1, wherein the field emission tip array is arranged within the vacuum region on an electrode and is connected electrically to said electrode which extends through an insulation body.

11. The X-ray source according to claim 10, wherein a gate electrode is connected in an electrically conductive manner via a wire bridge to a metal layer of the field emission tip array, and wherein the gate electrode is next to the electrode and penetrates through the insulation body.

12. The X-ray source according to claim 1, wherein a tip radius of the field emission tips is approximately 2 nm.

13. The X-ray source according to claim 11, wherein a voltage applied to the gate electrode is approximately 20-100 V.

14. The X-ray source according to any one of claim 1, wherein an operating voltage of the X-ray source is <5 kV, and at the field emission tip array wired as a cathode between −4980 and −4900 V.

15. The X-ray source according to claim 1 in combination with a bar-shaped multi-part support system, the support system comprising a bar-shaped hollow support profile into which, on a longitudinal side, a support profile comprising a metal is inserted in an insulated manner and to which a plurality of the X-ray sources are fastened in a longitudinal extension of the support profile spaced apart next to one another, and electrodes of the plurality of the X-ray sources extend into the support profile and are connected to high-voltage leads extending along the support profile, and that the X-ray sources protrude into an environment of the support system, and wherein an inner space of the support profile is filled with high-voltage insulation.

16. An X-ray source for ionizing of gases, with a field emission tip array in a vacuum chamber, comprising:

a field emission tip array with field emission tips arranged within a vacuum region enclosed by a hood and part of a carrier plate, wherein the field emission tip array is arranged electrically insulated with respect to the carrier plate and wired as a cathode connected to a high-voltage source, wherein a transmission window transparent to X-ray radiation is arranged in the hood centrally above the field emission tip array, wherein the hood is wired as an anode, wherein the field emission tip array is arranged within the vacuum region on an electrode and is connected electrically to said electrode which extends through an insulation body, and wherein a gate electrode is connected in an electrically conductive manner via a wire bride to a metal layer of the field emission tip array, and wherein the gate electrode is next to the electrode and penetrates through the insulation body.

* * * * *

UNITED STATES PATENT AND TRADEMARK OFFICE
CERTIFICATE OF CORRECTION

PATENT NO. : 10,529,527 B2
APPLICATION NO. : 15/552388
DATED : January 7, 2020
INVENTOR(S) : Thomas Sebald Page 1 of 1

It is certified that error appears in the above-identified patent and that said Letters Patent is hereby corrected as shown below:

In the Claims

Column 10, Line 44: Claim 16, Delete "bride" and insert -- bridge --

Signed and Sealed this
Eighteenth Day of February, 2020

Andrei Iancu
*Director of the United States Patent and Trademark Office*